United States Patent
Cocora et al.

(10) Patent No.: US 8,333,868 B2
(45) Date of Patent: Dec. 18, 2012

(54) APPARATUS, CARRIER AND METHOD FOR THE PLASMA TREATMENT OF MOLDS

(75) Inventors: Gabriela Cocora, Elsenfeld-Eichelsbach (DE); Axel Heinrich, Aschaffenburg (DE); Peter Hagmann, Erlenbach am Main (DE)

(73) Assignee: Novartis AG, Basel (CH)

( * ) Notice: Subject to any disclaimer, the term of this patent is extended or adjusted under 35 U.S.C. 154(b) by 240 days.

(21) Appl. No.: 12/321,444

(22) Filed: Jan. 21, 2009

(65) Prior Publication Data

US 2009/0188525 A1 Jul. 30, 2009

(30) Foreign Application Priority Data

Jan. 25, 2008 (EP) .................................... 08100923

(51) Int. Cl.
*C23F 1/00* (2006.01)

(52) U.S. Cl. ........... 156/345.51; 156/345.3; 156/345.43; 156/345.47; 134/1; 134/1.1

(58) Field of Classification Search ............... 134/1, 1.1; 156/345.51, 345.3, 345.43, 345.47
See application file for complete search history.

(56) References Cited

U.S. PATENT DOCUMENTS

| | | | | |
|---|---|---|---|---|
| 4,534,921 A * | 8/1985 | Fierkens et al. | ................. | 264/39 |
| 5,008,002 A | 4/1991 | Uno et al. | ................. | 204/192.31 |
| 5,573,715 A | 11/1996 | Adams et al. | ................. | 264/1.36 |
| 5,769,953 A * | 6/1998 | Yoshikawa et al. | ............ | 134/1.1 |
| 5,855,728 A * | 1/1999 | Saitoh et al. | ............. | 156/345.41 |
| 6,139,369 A * | 10/2000 | Arwidi et al. | ................. | 439/638 |
| 6,627,124 B1 * | 9/2003 | Herbrechtsmeier et al. | . | 264/1.36 |
| 6,776,854 B2 * | 8/2004 | Bardelmeier et al. | ......... | 148/213 |
| 6,783,603 B2 * | 8/2004 | Russell | ............. | 134/21 |
| 7,059,335 B2 | 6/2006 | Rothaug | ......... | 134/1.1 |
| 2003/0060302 A1 * | 3/2003 | Rogers et al. | ................. | 473/282 |
| 2004/0211217 A1 * | 10/2004 | Ohmi | ................. | 65/26 |
| 2005/0175727 A1 * | 8/2005 | Yang | ............. | 425/195 |
| 2005/0206019 A1 * | 9/2005 | Hodgkinson | ................. | 264/1.1 |
| 2006/0042545 A1 | 3/2006 | Shibata et al. | ............... | 118/722 |

FOREIGN PATENT DOCUMENTS

| | | |
|---|---|---|
| DE | 197 40 097 | 3/1999 |
| EP | 0 841 140 | 5/1998 |
| EP | 1332856 A1 * | 8/2003 |
| JP | 09272129 A * | 10/1997 |

OTHER PUBLICATIONS

PCT International Search Report dated Aug. 25, 2009.
PCT Written Opinion of the International Searching Authority dated Aug. 25, 2009.

* cited by examiner

*Primary Examiner* — Alexander Markoff
(74) *Attorney, Agent, or Firm* — Robert A. Ambrose

(57) ABSTRACT

An apparatus for the plasma treatment of molds (2), in particular for contact lens molds, comprises a treatment chamber (50), in which a first electrode (51) is arranged facing a carrier (1;4) for carrying the molds (2) to be treated. The carrier (1;4) forms the second electrode (52) and comprises a first metal plate (10;40) having holes (100;400) therein and a second metal plate (11;41) which is arranged spaced apart from the first metal plate (10;40), and which is connected to the first metal plate (10;40) in an electrically conductive manner (12, 13;43). The molds (2) are arranged on the second metal plate (11;41) with their molding surfaces (210) facing towards the first electrode (51) and are exposable to plasma through the holes (100;400) in the first metal plate (10;40).

15 Claims, 4 Drawing Sheets

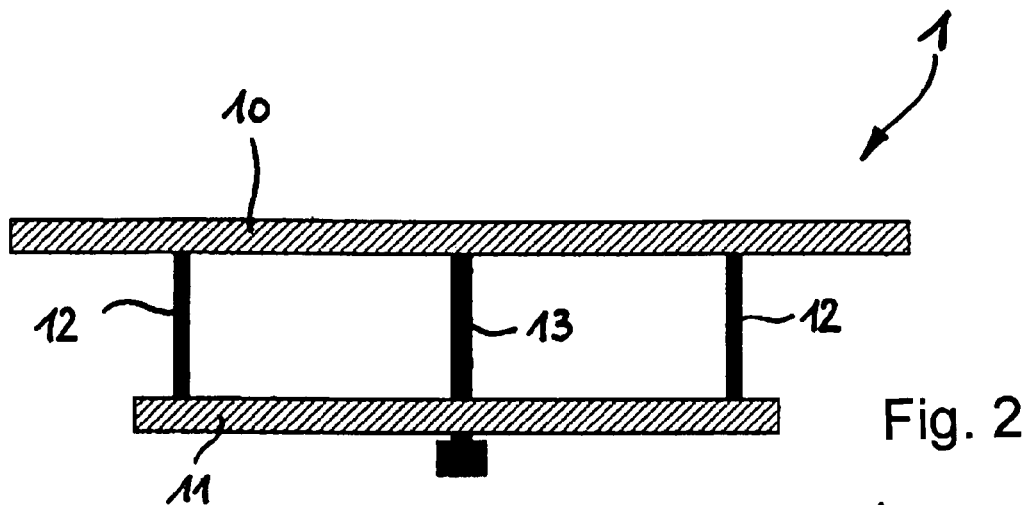
Fig. 2
Fig. 3     Fig. 4
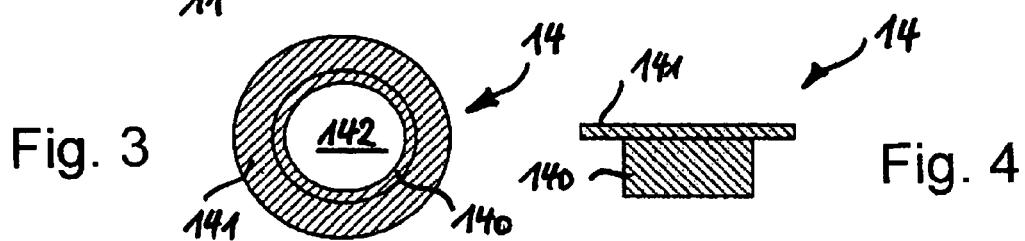
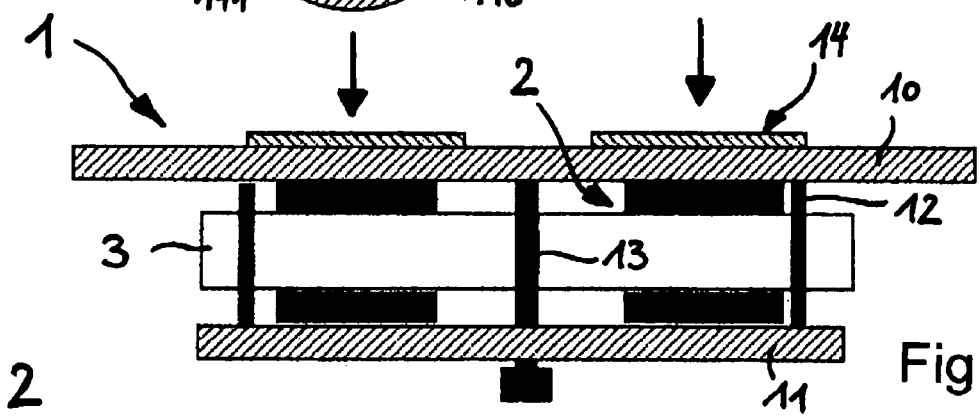
Fig. 5
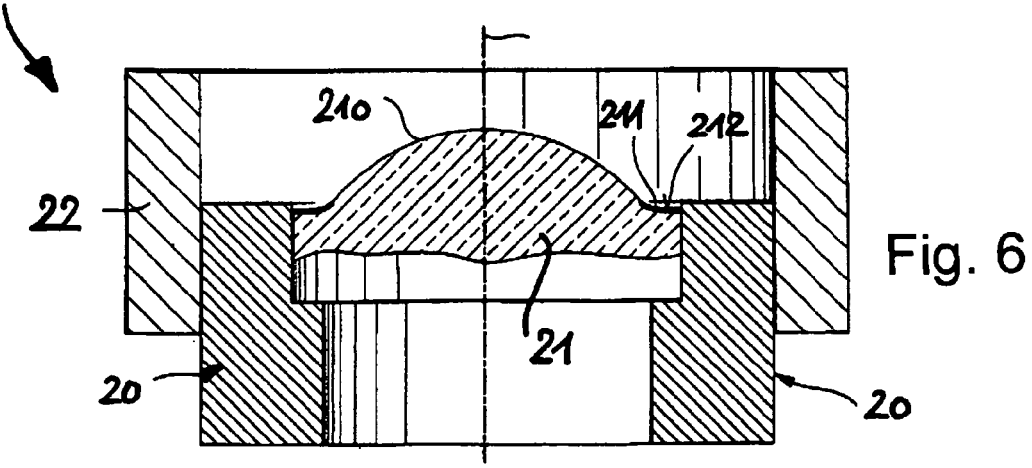
Fig. 6

APPARATUS, CARRIER AND METHOD FOR THE PLASMA TREATMENT OF MOLDS

This application claims benefit under 35 USC §119 of European patent application No. EP 08100923.5 filed Jan. 25, 2008, the contents of which are incorporated herein by reference in its entirety.

TECHNICAL FIELD

The present invention relates to an apparatus, a carrier and a method for the plasma treatment of molds. In particular, it relates to the plasma treatment of contact lens molds.

BACKGROUND OF THE INVENTION

During production of contact lenses, in particular but not only during manufacturing of single wear contact lenses in very large batch numbers, reusable molds can be used which typically comprise two molds halves essentially made of glass, e.g. of quartz glass or of glass called BK7 available from the company Glaswerke Schott, Mainz, Germany. It has shown to be advantageous when the glass molds or mold halves, respectively, have been exposed to a plasma, e.g. an oxygen plasma, prior to using the molds in production. This is described in more detail, for example, in EP-A-1 332 856.

The glass molds or molds halves, respectively, may be arranged in a plastic sleeve which helps in properly centering the mold halves during closing of the mold, as this is described, for example, in WO-A-99/20455. Exposing the molds or mold halves including the plastic sleeve, however, may result in that the molding surface of the glass molds or mold halves are contaminated with plastic from the sleeve during plasma exposure which may adversely influence the quality of the contact lenses to be produced. Also, exposure of the plastic sleeves to plasma adversely affects the plastic sleeves through oxidation, for example the plastic sleeves may become more brittle etc.

Accordingly, it is an object of the invention to suggest a method and an apparatus which prevent possible contamination of the molding surfaces of the glass molds during their exposure to plasma on one hand and on the other hand eliminate or at least greatly reduce exposure of any plastic components to plasma.

This object is achieved by an apparatus, a carrier and a method for the plasma treatment of molds as they are characterized by the features of the respective independent claims. Advantageous embodiments of the apparatus, the carrier and the method are the subject of the respective dependent claims.

In the following, when the term "mold" or "molds" is used it is intended to include the term "mold half" or "mold halves" wherever this is appropriate.

SUMMARY OF THE INVENTION

In particular, the apparatus for the plasma treatment of molds, in particular for contact lens molds, in accordance with the invention comprises a treatment chamber, in which a first electrode is arranged facing a carrier for carrying the molds to be treated. The carrier forms the second electrode and comprises a first metal plate having holes therein and a second metal plate which is arranged spaced apart from the first metal plate and which is connected to the first metal plate in an electrically conductive manner. The molds (or mold halves, see above) are arranged on the second metal plate with their molding surfaces facing towards the first electrode, and are exposable to plasma through the holes in the first metal plate.

Due to the fact that the first and second metal plates are connected to one another in an electrically conductive manner, there is no difference in the electric potential (that is to say there is zero voltage) between the first and second plates forming the second electrode, so that no plasma ignition may occur between the first and second plates of the carrier. However, plasma ignition is to occur between the first and second electrode (the second electrode being formed by the carrier). Due to the arrangement of the molds on the second metal plate with their molding surfaces facing towards the first electrode through the holes of the first metal plate, the molding surfaces of the molds can be exposed to plasma, whereas the plastic sleeve in which the mold may be arranged, extends underneath the first metal plate, so that it is shielded from exposure to plasma. This prevents the molding surfaces of the molds from contamination through plastic, but more importantly it prevents or at least greatly reduces exposure of the plastic sleeve to plasma, thus avoiding the adverse effects on the plastic sleeves caused by their exposure to plasma.

In one embodiment of the apparatus according to the invention, the first and second metal plates of the carrier are dimensioned such that when the carrier is arranged within the treatment chamber at least one of the first and second metal plates is in contact with the wall or walls of the treatment chamber. This embodiment allows to apply the desired electric potential to the metal plates of the carrier by applying this electric potential to the wall or walls of the treatment chamber which is then transferred to the metal plates through the contact between the wall or walls of the treatment chamber and the metal plates of the carrier. Due to the fact that there is no difference in the electric potential (zero voltage) between the first and second metal plates, no plasma ignition may occur between the first and second plates. In a particular embodiment, the wall or walls of the treatment chamber are also made from metal and have ground potential.

A further embodiment of the apparatus according to the invention comprises separate diaphragm inserts for the holes provided in the first metal plate. The diaphragm inserts each have an opening which is adapted to only expose the molding surface of the respective mold to plasma but to shield all other portions of the mold, in particular the inner faces of the plastic sleeves, from exposure. This embodiment is particularly advantageous since in this embodiment the openings in the first metal plate need not necessarily correspond to the size of the molding surfaces but can be larger than these. Depending on the respective size of the molding surface of a mold, it is possible to insert into the opening of the first metal plate a diaphragm having an opening having a size which is specifically adapted to the size of the molding surface of the respective mold. It is thus only necessary in case of molds having different sizes of molding surfaces to use the respective diaphragm insert, whereas the holes in the first metal plate of the carrier can be larger and, for example, these holes can all have the same size regardless of the size of the molding surfaces of the respective molds.

In a further embodiment of the apparatus according to the invention, two or more molds are arranged in a separate holder at a distance from one another which corresponds to the distance of the holes in the first metal plate, so that upon placement of the holder holding the two or more molds onto the second metal plate the holder is arranged between the first and second metal plates and the molds are arranged congruent to the holes in the first metal plate. This embodiment of the apparatus is particularly advantageous when separate holders for the molds are used during production of the contact lenses, since the molds or their molding surfaces, respectively, can then be exposed to plasma treatment with the molds already arranged in the respective holders which may be made from plastics and are shielded from exposure to plasma as already discussed above.

The first and second metal plates can be made from aluminum or any other suitable electrically conductive material. In case there is no mold arranged in some of the holes of the first metal plate, in accordance with a further embodiment of the apparatus according to the invention metal plugs may be arranged in these holes so as to shield any plastic parts arranged between the two metal plates from being exposed to plasma. The plasma may be an oxygen plasma, for example.

Another aspect of the invention relates only to a carrier for carrying molds during plasma treatment, which comprises in one embodiment a first metal plate having holes therein and a second metal plate which is arranged spaced apart from the first metal plate and which is connected to the first metal plate in an electrically conductive manner. The molds can be arranged on the second metal plate with their molding surfaces facing towards the holes in the first metal plate. The carrier further comprises separate diaphragm inserts for the holes provided in the first metal plate, with the diaphragm inserts each having an opening which is adapted to only expose the molding surface of the respective mold but to shield all other portions of the mold from exposure to plasma. The advantages of the embodiments of the carrier have already been mentioned above.

In accordance with a further embodiment of the said carrier, two or more molds are arranged in a separate holder at a distance from one another corresponding to the distance of the holes in the first metal plate can be placed onto the second metal plate such that the holder is arranged between the first and second metal plates and the molds are arranged congruent to the holes in the first metal plate.

The first and second metal plates of the carrier can be made from aluminum, for example. Also, as has already been mentioned when discussing the corresponding embodiment of the apparatus, metal plugs are arranged in holes of the first metal plate where no mold is arranged in the hole.

Still a further aspect of the invention relates to a method for plasma treatment of molds, in particular for contact lens molds, comprising in one embodiment the steps of: arranging the molds to be treated in a plasma treatment chamber; providing means for shielding parts of the molds other than the molding surfaces from being exposed to plasma, and exposing the shielded molds arranged in the plasma treatment chamber to a plasma.

The advantages of the method in accordance with the invention have already been discussed when discussing the advantages of the apparatus and, therefore, they need not be reiterated. In a further specific embodiment of the method according to the invention, the plasma is an oxygen plasma.

BRIEF DESCRIPTION OF THE DRAWINGS

Further advantageous aspects of the invention will become apparent from the following detailed description of preferred embodiments of the invention with the aid of the drawings in which:

FIG. 2 shows the first embodiment of the carrier according to the invention in an assembled state but without molds;

FIG. 3 shows a bottom view of an embodiment of a diaphragm insert which is to be inserted into a hole of the first metal plate;

FIG. 4 shows the diaphragm of FIG. 3 in a side view;

FIG. 5 shows an embodiment of a male mold that can be plasma treated using the first embodiment of the carrier according to the invention;

FIG. 6 shows the first embodiment of the carrier according to the invention in an assembled state with molds being arranged between the first and second metal plates and with diaphragms inserted;

DETAILED DESCRIPTION OF EXAMPLE EMBODIMENTS

Figure 1:
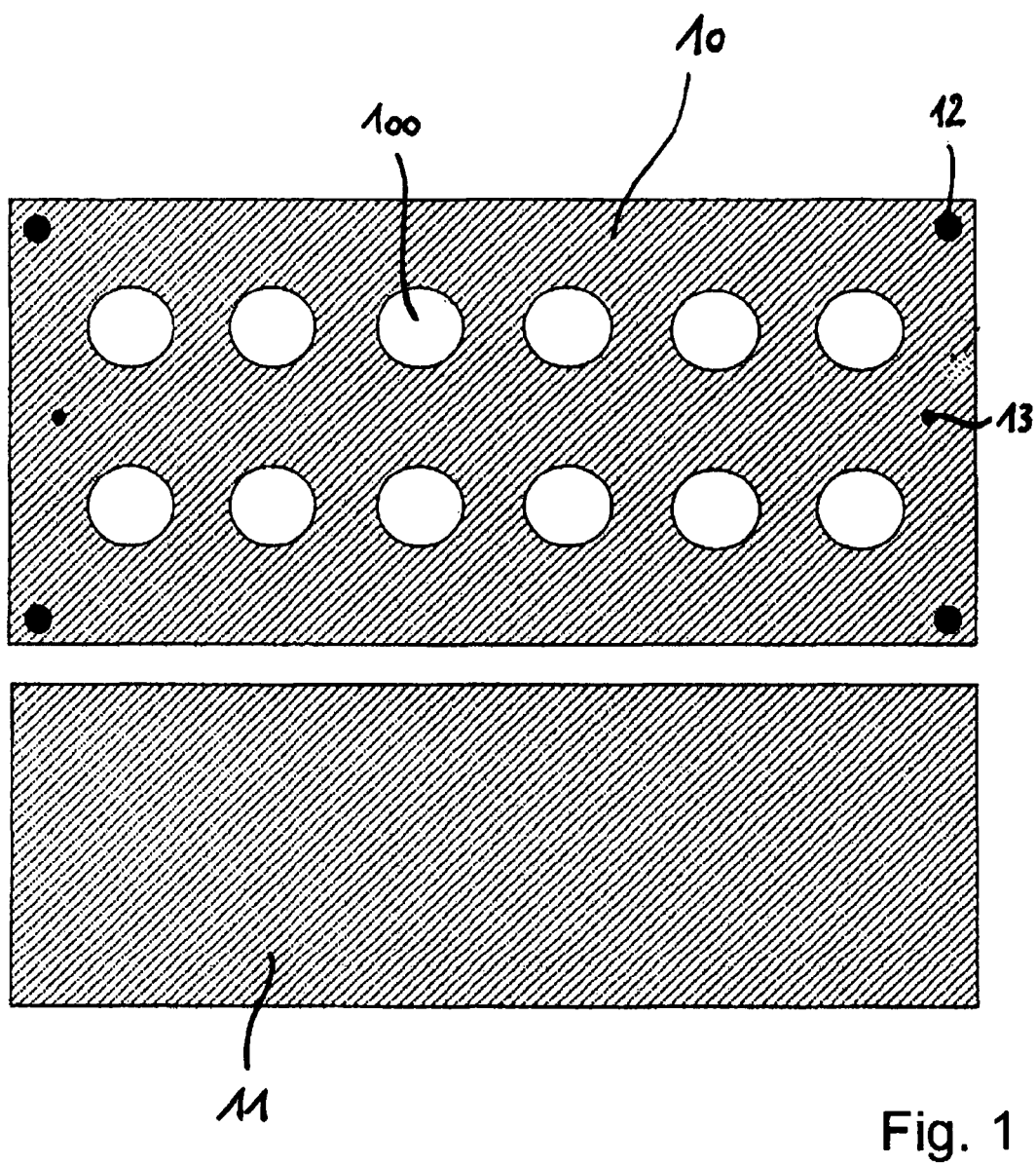
FIG. 1 shows the first and second metal plates of a first embodiment of the carrier according to the invention.

FIG. 1 shows the first metal plate 10 and the second metal plate 11 of a first embodiment of a carrier according to the invention. In this embodiment, the first metal plate 10 has twelve holes 100 therein, however, a different number of holes 100 is of course possible. The second metal plate 11 does not have any holes at all, since the molds are to be placed on second metal plate 11.

FIG. 2 shows the first embodiment of carrier 1 in an assembled state, however, without any molds being placed on second metal plate 11. First and second metal plates 10,11 are connected to one another in an electrically conductive manner. Pins 12 are arranged at the four corners, as this is shown in FIG. 2 (and as is already indicated in FIG. 1). The two plates are fixed to one another with the aid of screws 13, as this is shown in FIG. 2 (and as is already indicated in FIG. 1).

FIG. 3 and FIG. 4 show diaphragm inserts 14 which can be introduced into the holes after the molds have been arranged between the first and second plates 10,11 and after the first and second plates 10,11 have been fixed to one another with the aid of screws 13. The diaphragm inserts 14 comprise a cylindrical portion 140 and a laterally extending collar 141, and are provided with a diaphragm opening 142 having a diameter which is adapted to the diameter (size) of the molding surface of the respective mold.

By way of example, let us assume that the molds are male molds and look essentially like mold 2 represented in FIG. 6. Mold 2 comprises a mount 20 to which a molding member 21 is mounted having a molding surface 210. The molding member is made of glass, for example quartz glass or BK7. At a peripheral portion 211 of molding member 21 a mask 212 has been applied, for example a chromium mask. Mold 2 further comprises a sleeve 22 that helps in centering the molds as male mold 2 and a corresponding female mold are closed to form a contact lens. Sleeve 22 is typically made from plastics so as to allow a smooth closing of male mold 2 and the corresponding female mold.

In order to assemble the carrier 1 (assembled carrier shown in FIG. 5), firstly the molds 2 are introduced into the holes 100 of first metal plate 10 (with first metal plate being arranged on a plane surface, for example) with the distal ends of sleeves 22 protruding into holes 100. Second metal plate 11 is then fixed to first metal plate 10 with the aid of pins 12 which help in correctly arranging the first and second metal plates 10,11 with respect to one another, and with the aid of the screws 13 holding the first and second metal plates together with molds 2 arranged therebetween. A separate holder 3 may be provided holding a number of molds 2 at a distance from one another which corresponds to the distance between adjacent holes 100 in the first metal plate 10. However, such separate holders 3 are typically made from plastics so that they should also be shielded from being exposed to plasma to prevent the adverse effects discussed further above.

As the first and second metal plates 10,11 have been fixed to one another with the molds 2 arranged therebetween, the arrangement of the first and second metal plates 10,11 is turned upside down so that first metal plate 10 is now arranged at the upper side and second metal plate is arranged at the lower side. The diaphragm inserts 14, which are made of metal, are now inserted into the sleeves 22 until collar 141 abuts against the upper surface of first metal plate 10. The cylindrical portion 140 then shields the inner wall of sleeve 20 from being exposed to plasma while opening 142 allows only those portions of the molds 2 which are made of glass (or metal portions of the molds 2) to be exposed to plasma, that is to say only the molding surfaces 210 of the molds 2, while all other portions of the molds are shielded from exposure to plasma. Carrier 1 is shown in FIG. 5 in its fully assembled state, with the molds 2 and separate holders 3 arranged between first and second metal plates 10,11 and with diaphragm inserts 14 inserted as described above.

Figure 7:
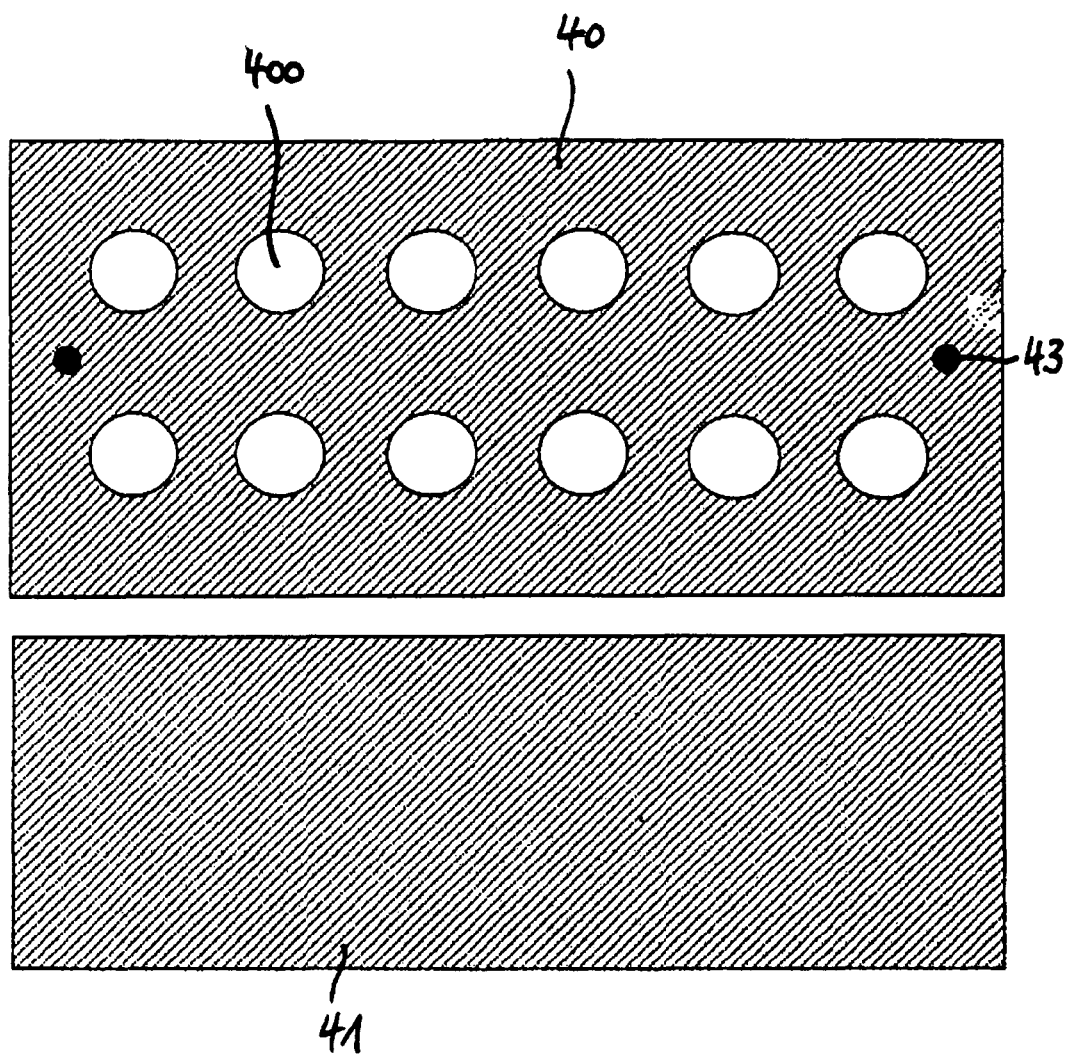
FIG. 7 shows the first and second metal plates of a second embodiment of the carrier according to the invention.
Figure 8:
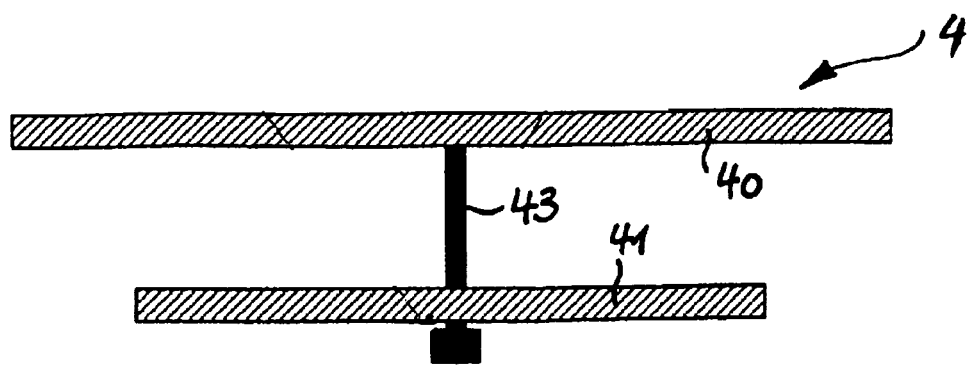
FIG. 8 shows the second embodiment of the carrier according to the invention in an assembled state but without molds.

FIG. 7 shows the first metal plate 40 and second metal plate 41 of a second embodiment of the carrier according to the invention in an unassembled state, whereas FIG. 8 shows the first and second plates 40,41 of carrier 4 in an assembled state but without molds being arranged between the first and second metal plates 40,41. The first and second plates are provided with holes 400 and are both fixed to one another and connected to one another in an electrically conductive manner with the aid of screws 43. In this embodiment there are no additional pins arranged at the corners of the first and second plates 40,41.

Figure 9:
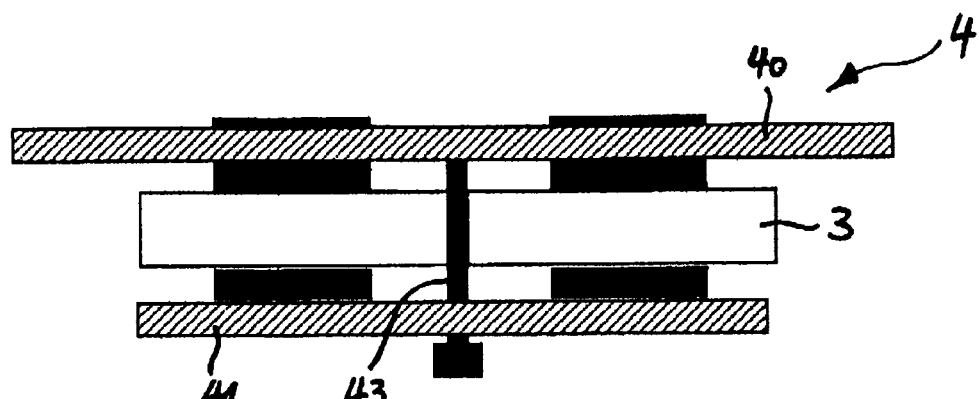
FIG. 9 shows the second embodiment of the carrier according to FIG. 8 but with molds being arranged between the first and second metal plates.

Also, a difference of this embodiment of the carrier 4 when compared to the first embodiment of the carrier 1 is, that no diaphragm inserts are provided. In FIG. 9 carrier 4 with the separate holder 3 for the molds is shown.

The way how to assemble the second embodiment of the carrier 4 with the molds and the holder 3 between the first and second plates 40 and 41, respectively, is similar to that already described for the first embodiment of the carrier 1. However, since the second embodiment of the carrier 4 is particularly suitable for female molds, and since the female molds in the described embodiment do not have a sleeve (since this is already provided at the male molds) but are simply accommodated in metal pieces, no diaphragm inserts are needed for shielding any plastic component (such as the sleeve 22 in the first embodiment of the carrier 1) from exposure to plasma.

Figure 10:
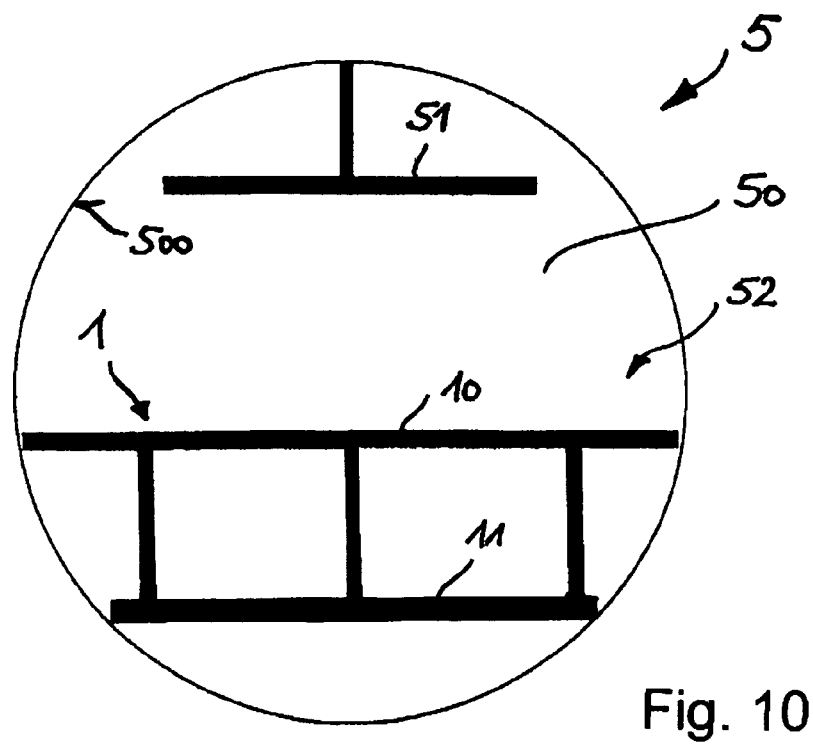
FIG. 10 shows (schematically) an embodiment of the apparatus according to the invention.

In FIG. 10 there is shown in a very schematic representation an embodiment of the apparatus 5 according to the invention. The apparatus comprises a treatment chamber 50, which is cylindrically shaped. Apparatus 5 of this embodiment further comprises a first electrode 51 and a second electrode 52, which are capable of generating a plasma between first electrode 51 and second electrode 52. A suitable plasma gas may be oxygen, for example. The second electrode 52 is formed by a carrier as it has been described above, for example by carrier 1 (or by carrier 4, respectively). As is schematically shown in FIG. 10, the second electrode 52 is in electrically conductive contact with the wall 500 or walls of treatment chamber 50. That is to say, at least one of the first and second metal plates of carrier 1 (or carrier 4, respectively), is in contact with the wall 500 or wall of treatment chamber 50. The wall 500, which is also made from metal, e.g. from aluminum, may have ground potential.

Since the first and second metal plates 10,11 of carrier 1 are connected to one another in an electrically conductive manner, it is not possible for plasma ignition to occur between the first and second metal plates 10,11. However, it may nevertheless be possible for plasma to leak into the space below the second metal plate 11 due to suction which is continuously applied to treatment chamber 50. Second metal plate 11, therefore, has not only the function of a support for the molds but in addition it forms a barrier for plasma that has leaked into the space below second metal plate 11.

Also, in case no mold is present in one or more of the holes of the first metal plate 10 or 40, respectively, a metal plug may be inserted in that hole to shield any components arranged between first and second metal plates 10,11 from being exposed to plasma and/or to prevent or at least greatly reduce plasma leaking into the space between the first and second metal plates 10,11 or 40,41, respectively.

It is preferred although not mandatory, that all electrically conductive components such as metal plates, diaphragm inserts, plugs, pins, etc. be made from the same material, e.g. from metal such as aluminum.

The invention claimed is:

1. An apparatus for plasma treatment of molds comprising a treatment chamber in which a first electrode is arranged facing a carrier for carrying the molds to be treated, the carrier forming the second electrode and comprising a first metal plate having holes therein and a second metal plate arranged spaced apart from the first metal plate and which is connected to the first metal plate in an electrically conductive manner, and the molds being arranged on the second metal plate with their molding surfaces facing towards the first electrode and being exposable to plasma through the holes in the first metal plate.

2. The apparatus according to claim 1, wherein the first and second metal plates of the carrier are dimensioned such that when the carrier is arranged within the treatment chamber at least one of the first and second metal plates is in contact with a wall or walls of the treatment chamber.

3. The apparatus according to claim 1, further comprising separate diaphragm inserts for the holes provided in the first metal plate, with the diaphragm inserts each having an opening which is adapted to only expose the molding surface of the respective mold but to shield all other portions of the mold from exposure to plasma.

4. The apparatus according to claim 2, further comprising separate diaphragm inserts for the holes provided in the first metal plate, with the diaphragm inserts each having an opening which is adapted to only expose the molding surface of the respective mold but to shield all other portions of the mold from exposure to plasma.

5. The apparatus according to claim 2, wherein the wall or walls of the treatment chamber are made of metal and have ground potential.

6. The apparatus according to claim 1, wherein two or more molds are arranged in a separate holder at a distance from one another which corresponds to the distance of the holes in the first metal plate, so that upon placement of the holder holding the two or more molds onto the second metal plate the holder is arranged between the first and second metal plates and the molds are arranged congruent to the holes in the first metal plate.

7. The apparatus according to claim 2, wherein two or more molds are arranged in a separate holder at a distance from one another which corresponds to the distance of the holes in the first metal plate, so that upon placement of the holder holding the two or more molds onto the second metal plate the holder is arranged between the first and second metal plates and the molds are arranged congruent to the holes in the first metal plate.

8. The apparatus according to claim 1, wherein the first and second metal plates are made from aluminum.

9. The apparatus according to claim 1, wherein metal plugs are arranged in holes of the first metal plate where no mold is arranged in the hole.

10. The apparatus according to claim 1, wherein the plasma is an oxygen plasma.

11. The apparatus according to claim 4, wherein the plasma is an oxygen plasma.

12. A carrier for carrying molds during plasma treatment, comprising a first metal plate having holes therein and a second metal plate which is arranged spaced apart from the first metal plate and which is connected to the first metal plate in an electrically conductive manner, so that the molds can be arranged on the second metal plate with their molding surfaces facing towards the holes in the first metal plate, the carrier further comprising separate diaphragm inserts for the holes provided in the first metal plate, with the diaphragm inserts each having an opening which is adapted to only expose the molding surface of the respective mold but to shield all other portions of the mold from exposure to plasma.

13. The carrier according to claim 12, wherein two or more molds arranged in a separate holder at a distance from one another corresponding to the distance of the holes in the first metal plate can be placed onto the second metal plate such that the holder is arranged between the first and second metal plates and the molds are arranged congruent to the holes in the first metal plate.

14. The carrier according to claim 13, wherein the first and second metal plates are made from aluminum.

15. The carrier according to claim 13, wherein metal plugs are arranged in holes of the first metal plate where no mold is arranged in the hole.

\* \* \* \* \*